United States Patent [19]

Maida

[11] 4,365,236

[45] * Dec. 21, 1982

[54] DIGITAL DISPLAY CIRCUIT DISPLAYABLE IN ANALOG FASHION

[75] Inventor: Osamu Maida, Tokyo, Japan

[73] Assignee: Nippon Kogaku K.K., Tokyo, Japan

[ * ] Notice: The portion of the term of this patent subsequent to Apr. 14, 1998, has been disclaimed.

[21] Appl. No.: 176,579

[22] Filed: Aug. 8, 1980

Related U.S. Application Data

[62] Division of Ser. No. 907,210, May 18, 1978, abandoned.

[30] Foreign Application Priority Data

May 20, 1977 [JP] Japan ............................... 52-57554
Jul. 7, 1977 [JP] Japan ............................... 52-81273

[51] Int. Cl.³ ......................................... H03K 13/175
[52] U.S. Cl. ...................... 340/347 AD; 340/347 M; 354/230
[58] Field of Search .... 340/347 M, 347 AD, 347 CC, 340/726, 753, 754, 791; 354/23 A, 23 D, 53, 60 L; 328/181–184

[56] References Cited

U.S. PATENT DOCUMENTS

| | | | |
|---|---|---|---|
| 3,275,871 | 9/1966 | Yiotis | 340/753 |
| 3,302,040 | 1/1967 | Dryden | 328/183 X |
| 3,440,637 | 4/1969 | Molnar et al. | 340/753 |
| 3,653,029 | 3/1972 | Kuhlmann | 340/347 AD |
| 3,656,152 | 4/1972 | Gundersen | 340/347 AD |
| 3,723,762 | 3/1973 | Nakaya | 328/184 X |
| 3,838,413 | 9/1974 | Wehrmann | 328/59 X |
| 3,877,022 | 4/1975 | Lehman et al. | 340/347 AD |
| 3,879,724 | 4/1975 | McDonald | 340/347 AD |
| 3,914,758 | 10/1975 | Ingle | 340/756 |
| 3,949,170 | 4/1976 | Shionoya | 340/347 AD X |
| 3,976,869 | 8/1976 | Stella et al. | 364/730 X |
| 3,990,799 | 11/1976 | Nanba et al. | 354/60 L X |
| 4,074,292 | 2/1978 | Nakamoto et al. | 354/60 L X |

Primary Examiner—Thomas J. Sloyan
Attorney, Agent, or Firm—Fitzpatrick, Cella, Harper & Scinto

[57] ABSTRACT

A display circuit for displaying analog input voltages in a digital fashion using a parallel comparison type analog-digital converter includes a voltage generator for generating a plurality of reference voltages quantized at a predetermined voltage width, a plurality of comparators corresponding to the plurality of reference voltages for comparing the reference voltages and an analog input voltage as input, and display means for encoding and displaying the output of the plurality of comparators, is provided with modulating apparatus for modulating one of the inputs of each of the plurality of comparators periodically within the range of the predetermined voltage width.

7 Claims, 15 Drawing Figures

DIGITAL DISPLAY CIRCUIT DISPLAYABLE IN ANALOG FASHION

This is a division of application Ser. No. 907,210, filed May 18, 1978 abandoned.

BACKGROUND OF THE INVENTION

1. Field of the Invention

This invention relates to a display circuit using a parallel-comparison type analog digital converter for converting analog signals into digital signals by means of a plurality of comparators.

2. Description of the Prior Art

In the parallel comparison type analog-digital converter of the prior art, a plurality of quantization reference voltages having different values have been compared with an analog input voltage by a plurality of comparators and a digital signal has been put out which indicates what quantization reference voltage the analog input voltage corresponds to. The digital signal is visually displayed by turning on and off corresponding LED (light emitting diode) display elements or the like.

However, in such analog-digital converter, as the number of display modes is greater, namely, as the number of quantizations of the reference voltages corresponding to analog signals is greater, the number of comparators and the number of LED display elements become greater, which in turn leads to greater mining requirements and increased power consumption, and also to a greater space occupied by the analog-digital converter.

SUMMARY OF THE INVENTION

Accordingly, it is a primary object of the present invention to provide an analog-digital converter which overcomes the above-noted disadvantages, namely, a simple display circuit in which the number of comparators is less as compared with the number of display modes required.

It is a further object of the present invention to provide a display circuit by which an analog input digital signal existing in an intermediate range of two adjacent quantization values may be displayed as a digital signal incorporating analogous display.

According to the present invention, the display circuit for displaying analog input voltages in a digital fashion uses a parallel comparison type analog-digital converter comparising means for generating a plurality of reference voltages quantized at a predetermined voltage width, a plurality of comparator means corresponding to the plurality of reference voltages for comparing the reference voltages and an analog input voltage as input, and display means for encoding and displaying the output of the plurality of comparator means. The display circuit is provided with modulating means for modulating one of the inputs of each of the plurality of comparators periodically within the range of the predetermined voltage width.

The invention will become more fully apparent from the following detailed description of some embodiments thereof taken in conjunction with the accompanying drawings.

BRIEF DESCRIPTION OF THE DRAWINGS

FIGS. 2-A and 2-B are time charts illustrating the operation of the first embodiment;

FIGS. 4-A and 4-B are time charts illustrating the operation of the second embodiment;

FIGS. 6-A, 6-B, 6-C, 6-D

FIGS. 11-A, 11-B, 11-C, 11-D, 11-E and 11-F are time charts illustrating the operation of the fourth embodiment.

DESCRIPTION OF THE PREFERRED EMBODIMENTS

Figure 1:
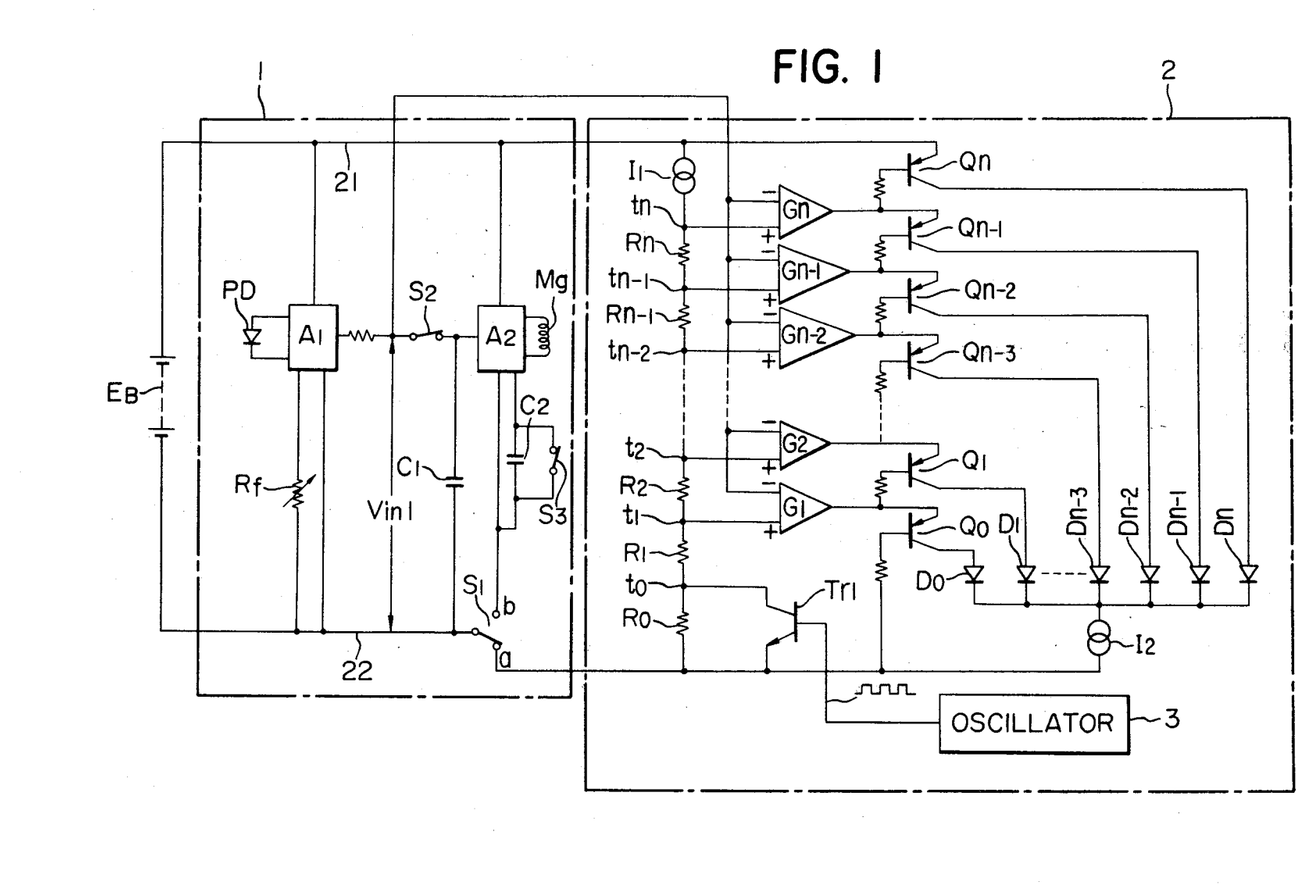
FIG. 1 is a circuit diagram showing a first embodiment of the display circuit according to the present invention.

Referring to FIG. 1, it is a circuit diagram showing a first embodiment of the present invention. In this embodiment, the conventional electric shutter circuit for a camera is employed as an analog signal source. In FIG. 1, the electric shutter circuit 1 has a memory capacitor C1 which provides the analog signal source, and the charging voltage $Vin_1$ of this memory capacitor C1 is converted into an analog signal by an analog-digital converter 2. The electric shutter circuit 1 and the analog-digital converter circuit 2 are connected between a power line 21 connected to the positive pole of a power source EB and a line 22 connected to the negative pole of the power source, and supplied with power from the source.

The electric shutter circuit 1 is a constructed as follows. An electrical signal from a photodiode PD corresponding to the brightness of the object and an electrical signal from a variable resistor Rf corresponding to the aperture value and film sensitivity are treated by a first operating circuit A1, and stored in the memory capacitor C1 as a voltage variable in arithmetrical series in accordance with the shutter speed which may provide a proper exposure. A memory switch S2 and a trigger switch S3 are closed before shutter release and opened after shutter release. A shutter switch S1 selects a terminal a before shutter release and connects the power source EB to the analog-digital converter 2, and after shutter release takes place, the shutter switch S1 selects a terminal b and connects the power source to a second operating circuit A2.

Now, when the shutter release takes place, the forward shutter curtain (not shown) is moved to start exposure while the shutter switch S3 is opened, so that the capacitor C2 is charged. The second operating circuit A2 compares the charging voltage of the capacitor C2 with the charging voltage of the memory capacitor C1 just before the shutter release, and if the voltages reach a predetermined relation, the second operating circuit A2 triggers a magnet Mg to move a rearward shutter curtain (not shown). Thus, exposure adjustment may be accomplished at a shutter speed from which proper exposure may be automatically obtained. What has been described above is a well-known operation and need not be further described.

The analog-digital converter 2 utilizes as input the charging voltage of the memory capacitor C1 and converts it into a digital signal. Ladder resistors R1-Rn generally equal in resistance value and ladder resistor Ro to be described hereinafter are series-connected between the lines 21 and 22 through a constant current source $I_1$, and respective junctions $t_1$–$t_n$ produce quantization reference voltages determined by a current $i_1$ flowing from the constant current source and the respective composite resistance values. A transistor Tr1 is parallel-connected to the ladder resistor Ro. This transistor Tr1 and the resitor Ro together constitute a circuit for modulating the quantization reference voltages. An oscillator 3 puts out rectangular pulses of duty rate 50% and applies them to the base of the transistor Tr1. By such pulses from the oscillator 3, the transistor Tr1 is turned on or off to short-circuit the ladder resistor Ro or release the short-circuiting of the ladder resistor. Junctions $t_1$–$t_n$ produce quantization reference voltages which are stepwisely varied at an equal unit voltage and successively lowered from the point $t_n$ to $t_1$. Upon turn on or off of the transistor Tr1, the respective quantization reference voltages at the junctions $t_n$–$t_1$ are modulated by a voltage amplitude determined by the ladder resistor Ro and the current from the constant current source $I_1$. Each of the quantization reference voltages so modulated is represented as a dotted line in FIG. 2. The inversion input terminals of comparators G1-Gn are connected to one end of the memory capacitor C1 through the memory switch S2 and supplied with the charging voltage $Vin_1$ of the memory capacitor. On the other hand, the non-inversion input terminals of comparators G1-Gn are successively connected to the junctions $t_1$–$t_n$ and supplied with the quantization reference voltages produced thereby. Each of the comparators G1-Gn puts out a high-level signal (hereinafter referred to as H-signals) when the charging voltage $Vin_1$ of the memory capacitor C1 applied to the inversion input terminals is lower than the quantization reference voltage applied to the non-inversion input terminals, and puts out a low-level signal (hereinafter referred to as L-signals) when said charging voltage is higher than said quantization reference voltage.

The emitter of a transistor Qo is connected to the output terminal of the comparator G1, the base thereof is connected to the line 22, and the collector thereof provides an output stage. This transistor Qo detects the fact that the charging voltage of the memory capacitor C1 is less than the quantization reference voltage of the comparator G1. The emitter of a transistor Q1 is connected to the output terminal of the comparator G2, the base thereof is connected to the output terminal of the comparator G1, and the collector thereof provides an output stage. Each of transistors Q3-Qn-1, like transistor Q1, has their emitters and base connected between the output terminals of the comparators whose quantization reference voltages differ by one stage, and the collectors thereof provide output stages. The transistors Q1-Qn-1 receive the outputs from the comparators whose quantization reference voltages differ by one stage, and put out signals representing the quantization reference voltage to which the charging voltage of the memory capacitor C1 corresponds. The emitter of a transistor Qn is connected to the line 21, the base thereof is connected to the output terminal of the comparator Gn, and the collector thereof provides an output stage. This transistor Qn detects the fact that the charging voltage $Vin_1$ of the memory capacitor C1 is higher than the quantization reference voltage of the comparator Gn. These transistors Qo-Qn generate outputs for encoding the outputs of the comparators G1-Gn. LED display elements Do-Dn are provided corresponding to the transistors Qo-Qn, and they are connected between the collectors of the associated transistors and the constant current source $I_2$. The relations of correspondence therebetween are such that the transistors Qo, Q1, . . . , Qn drive the LED display elements Do, D1, . . . , Dn, respectively. These LED display elements Do-Dn are disposed, for example, within the viewfinder of a camera and opposed to the scale which indicates the shutter speeds. By doing so, the shutter speed which may provide proper exposure can be displayed within the viewfinder.

Figure 2A:
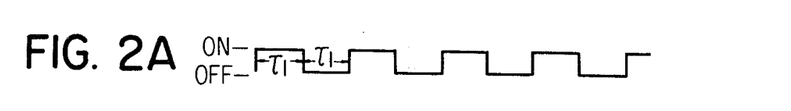
Figure 2B:
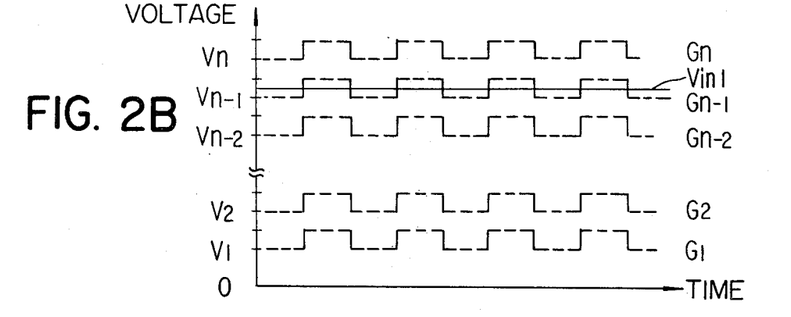

Operation will now be described by reference to the time charts of FIGS. 2-A and 2-B. FIG. 2-A shows turn on and off of the transistor Tr1. FIG. 2-B shows turn on and off of the transistor Tr1 and the quantization reference voltages V1-Vn produced at the junctions $t_1$–$t_n$, respectively. These figures refer to the case where the value of the ladder resistor Ro is selected to one half of the values of the other ladder resistors, namely, the case where the quantization reference voltage generated at the junctions $t_1$–$t_n$ are varied at half the amplitude of the quantization unit voltage.

The transistor Tr1 repeats ON and OFF at a predetermined time interval $\tau_1$ with the aid of the pulse from the oscillator 3 and therefore, the quantization reference voltage produced at the junction $t_1$ is varied between two low and high values at half the amplitude of the quantization unit voltage and at the same time, the quantization reference voltages produced at the other junctions $t_2$–$t_n$ are also varied between two corresponding values at the same amplitude. If the charging voltage $Vin_1$ of the memory capacitor C1 is lower than the low value of the quantization reference voltage V1 produced at the junction $t_1$, the comparators G1-Gn put out H-signals at their output terminals. Therefore, the transistor Qo is turned on to turn on the LED display element Do continuously while the other transistors Q1-Qn are turned off to turn off the LED display elements D1-Dn.

When the charging voltage $Vin_1$ rises to reach between the low and high values of the quantization reference voltage V1 produced at the junction $t_1$, the comparator G1 puts out L-signal and H-signal alternately in accordance with the ON and OFF condition of the transistor Tr1 while the other comparators G2-Gn still continue to put out H-signal. Therefore, when the comparator G1 puts out L-signal, the transistors Qo is turned off and the transistor Q1 is turned on. When the comparator G1 puts out H-signal, the transistor Qo is turned on and the transistor Q1 is turned off. The LED display elements Do and D1 alternately repeat ON and OFF in response to the ON and OFF of the transistors Qo and Q1. Also, the transistors Q2-Qn are turned off because the comparators G2-Gn are putting out H-signals, and thus the LED display elements D2-Dn are turned off.

When the charging voltage $Vin_1$ further rises and reaches between the high value of the quantization reference voltage V1 and the low value of the quantization reference value V2 at the junction $t_2$, the comparator G1 puts out L-signal only while the other comparators G2-Gn still continuwe to put out H-signal. Since the comparator G1 is putting out L-signal, the transistor Qo is turned off to turn off the LED display element Do. Since the comparator G1 is putting out L-signal and the comparator G2 is putting out H-signal, the transistor Q1 is turned on to continuously turn on the LED display element D1. The other transistors Q2-Qn are turned off as already described, thus turning off the LED display elements D2-Dn.

When the charging voltage $Vin_1$ thus reaches between the low and high values of the next quantization reference voltage V3, the comparator G2 puts out H-signal and L-signal alternately, so that the LED display elements D1 and D2 are alternately turned on and off. Thereafter, as the charging voltage $Vin_1$ rises, the operation similar to that described above shifts to comparators producing higher quantization reference voltages and correspondingly to this, the LED display elements which are to be turned on and off also shift in succession. When the charging voltage $Vin_1$ exceeds the high value of the quantization reference voltage Vn produced at the junction $t_n$, all the comparators Gn-G1 put out L-signals so that the transistor Qn alone is turned on to continuously turn on the LED display element Dn. Such state does not change even if the charging voltage $Vin_1$ further rises. If the charging voltage $Vin_1$ becomes lower than this stage, the state changes reversely, i.e. from the comparator of greater quantization reference voltage amplitude to the comparator of lower quantization reference voltage, and the LED display elements which are to be turned on and off in response thereto shift from Dn to D1, of course.

As is apparent from the foregoing description, when the charging voltage $Vin_1$ is completely included outside the amplitude of a certain quantization reference voltage, a certain LED display element is continuously turned on and when the charging voltage is included in the amplitude of a certain quantization reference voltage, two LED display elements, i.e. a certain LED display element and the next one, are alternately turned on and off. Where such operation is utilized to display, for example, within the viewfinder of a camera, shutter speeds such as 1/1000, 1/500, 1/250, 1/125, 1/60, 1/30, 1/15, 1/8, 1/4, 1/2 and 1, it is possible to cause only one LED display element to display each of 1/1000, 1/250, 1/60, 1/15, 1/4 and 1, and where 1/500 is to be displayed, the LED display elements for 1/1000 and 1/250 may be alternately turned on and off, thereby reducing the numbers of the LED display elements, comparators and ladder resistors to half the numbers heretofore employed.

It is to be noted that the LED display elements Do and Dn display that the charging voltage $Vin_1$ is outside the upper or the lower limit of the quantization reference voltage.

Figure 3:
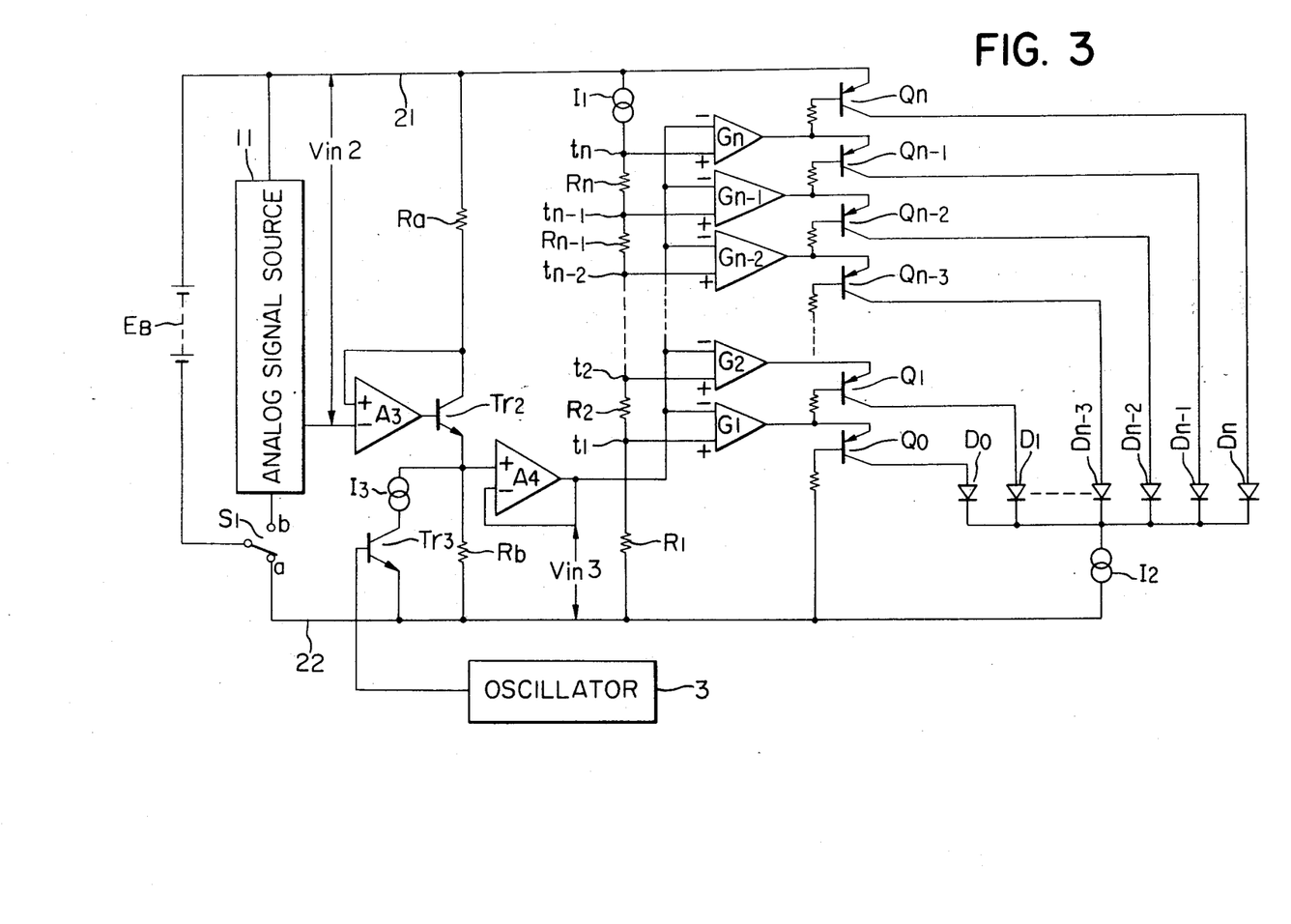
FIG. 3 is a circuit diagram showing a second embodiment of the present invention.

FIG. 3 shows the circuit according to a second embodiment of the present invention. The analog-digital converter shown there has many portions similar to those shown in FIG. 1 and so, such portions are given similar reference characters and the details thereof need not here be described. In the second embodiment, the quantization reference voltages applied to the non-inversion input terminals of the comparators G1-Gn are fixed and the analog signal voltage applied to the inversion input terminal is modulated at a predetermined voltage width and at a predetermined period.

In FIG. 3, the analog input voltage $Vin_2$ from the analog signal source 11 is applied between the inversion input terminal of an operational amplifier A3 and the power line 21. The non-inversion input terminal of the operational amplifier A3 is connected to the power line 21 through a resistor Ra. The collector of a transistor Tr2 is connected to the junction between the non-inversion input terminal of the operational amplifier A3 and the resistor Ra, the base thereof is connected to the output terminal of the operational amplifier A3, and the emitter thereof is connected to the line 22 through a resistor Rb. The operational amplifier A3 and the transistor Tr2 together constitute a constant current circuit for transmitting to the resistor Rb a current determined by the analog input voltage $Vin_2$ and the resistor Ra. Here, assuming that the hfe of the transistor Tr2 (hfe is an abbreviation of the emitter-collector current gain)$>>1$, the emitter current and the collector current of this transistor become substantially equal to each other. The non-inversion input terminal of an operational amplifier A4 is connected to the junction between the emitter of the transistor Tr2 and the resistor Rb, and the inversion input terminal thereof is connected to the output terminal thereof. Thus, the operational amplifier A4 provides a voltage follower circuit which puts out a second analog voltage $Vin_3$ which is coincident with the voltage corresponding to the analog input voltage produced across the resistor Rb. Comparators G1-Gn compare the second analog voltage $Vin_3$ with the quantization reference voltage V1-Vn produced at the junctions $t_1$-$t_n$. The ladder resistor Ro shown in FIG. 1 is eliminated in this embodiment because it is not necessary. A constant current source $I_3$ is parallel-connected to the resistor Rb. A transistor Tr3, whose ON and OFF is controlled by a pulse of a predetermined period from the oscillator 3, controls the shunt of the emitter current of the transistor Tr2 which flows into the constant current source $I_3$. By the control of the current flowing to this constant current source $I_3$, the voltage produced across the resistor Rb, namely, the second analog voltage $Vin_3$ put out from the operational amplifier A4, is set so as to be varied with the increase or or decrease of one half of the amplitude of the quantization unit voltage. The operational amplifier A3, transistors Tr2 and Tr3, resistors Ra and Rb, and constant current source $I_3$ together constitute an analog input voltage modulating circuit.

Figure 4A:
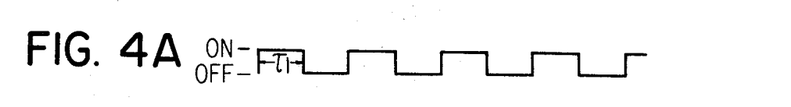
Figure 4B:
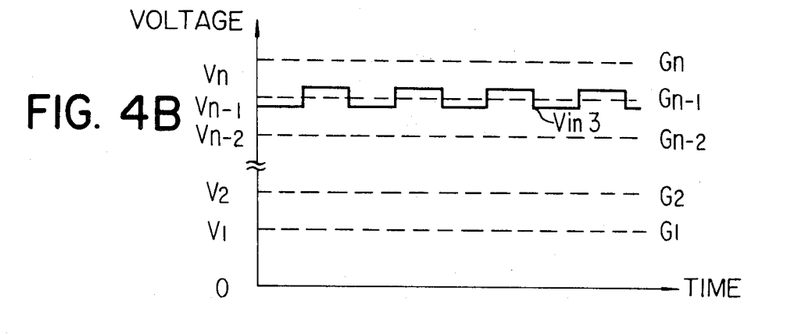

Reference is now had to the time charts of FIGS. 4-A and 4-B to describe the operation. FIG. 4-A shows ON and OFF state of the transistor Tr3 and FIG. 4-B shows the relation between the variation in the second analog voltage $Vin_3$ resulting from the turn on and off of the transistor Tr3 and the quantization reference voltage. If the analog voltage $Vin_2$ from the analog signal source rises, the second analog voltage $Vin_3$ put out by the operational amplifier A4 also rises. The second analog voltage $Vin_3$ is being varied between two high and low values with the ON and OFF of the transistor Tr3. First, when the high value of the second analog voltage $Vin_3$ is lower than the quantization reference value at the junction $t_1$, the comparators G1-Gn put out H-signals to turn on the transistor Qo and turn off the other transistors Q1-Qn. By this, the LED display element Do is continuously turned on while the other LED display elements are not turned on. Next, when the second analog voltage $Vin_3$ rises so that the quantization reference voltage V1 comes to lie between the high and low values of the second analog voltage, the comparator G1 puts out H-signal and L-signal alternately in response to ON and OFF of the transistor Tr3 while the other comparators G2-Gn still continue to put out H-signals. By the H-signal and L-signal alternately put out by the comparator G1, the transistors Qo and Q1 repeat ON and OFF alternately so that LED display elements Do and D1 are turned on and off alternately. Next, when the high and low values of the second analog voltage $Vin_3$ reaches between the quantization reference voltages V2 and V3, the comparator G1 puts out L-signal while the other comparators still continues to put out H-signals. Therefore, the LED display element D1 alone is turned on. Thereafter, as the second analog voltage $Vin_3$ rises, the LED display elements D1 and D2 are alternately turned on and off and next, the LED display element D2 alone is turned on. In such a fashion, the turn on of the LED display elements shift toward the LED display element Dn.

In the description of the first and second embodiments, one of the input voltages of the comparators G1-Gn has been periodically varied at $\frac{1}{2}$ of the amplitude of the quantization unit voltage, but this is not restrictive. For example, if one of input voltages of the comparators G1-Gn is periodically varied at an amplitude fully approximate to the quantization unit voltage, the variation width of the analog input voltage for which only one of the LED display elements is turned off is restricted narrowly, and therefore if, for example, voltage scale is opposed to each LED display element, more precise voltage measurement can be accomplished by turn on of one LED display element.

Conversely, if one input voltage is periodically varied at an amplitude smaller than one half of the quantization unit voltage, the variation width of the analog input voltage for which two LED display elements are alternately turned on can be restricted narrowly. Thus, by suitably determining the periodically varied amplitude, the display mode can be freely set up.

According to the described embodiments of the present invention, the input signal of one of plural comparators is periodically varied at a predetermined amplitude and therefore, each comparator operates as if two distinct quantization reference voltages were applied thereto at a predetermined time interval. This doubles the analog input signal amplitude which may be quantized by a certain number of comparators, and yet the power consumed is the same as heretofore consumed. Also, the number of comparators is not increased and accordingly, the number of ladder resistors is not increased, which means a great economical advantage in that the IC chip area can be reduced during the making of the analog-digital converter into an integrated circuit.

Figure 5:
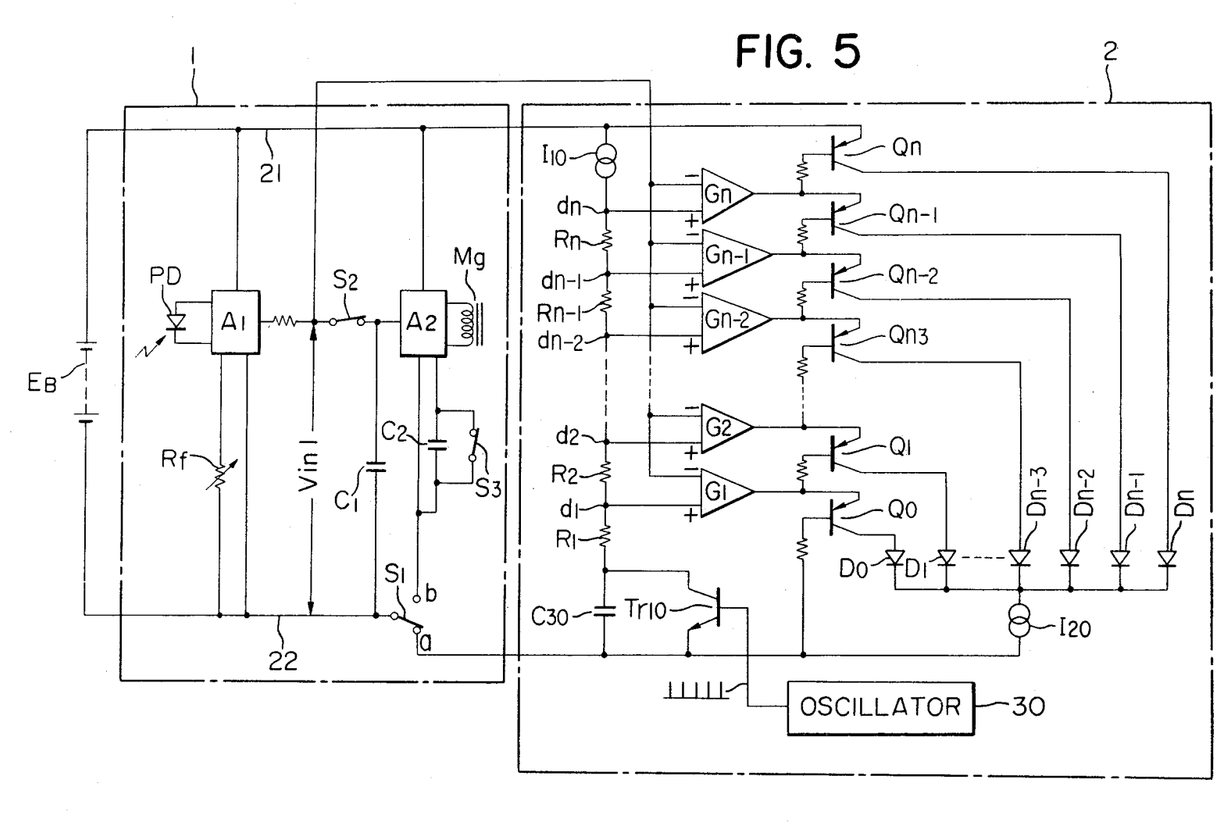
FIG. 5 is a circuit diagram showing a third embodiment of the present invention.

FIG. 5 is a circuit diagram showing a third embodiment of the present invention. The display circuit 2 in this embodiment will now be described. A plurality of ladder resistors R1-Rn equal in resistance value and a capacitor C30 to be described are series-connected between power lines 21 and 22 through a constant current source $I_{10}$. Junctions $d_1-d_n$ between these produce quantization voltages determined by the current flowing thereto from the constant current source $I_{10}$ and each composite resistance value. Since the ladder resistors R1-Rn are equal, these quantization voltages stepwisely differ from one another with the difference corresponding to the quantization unit voltage. Transistor Tr10 is parallel-connected to the capacitor C30. A pulse generator 30 generates a short pulse of a predetermined period which is applied to the base of the transistor Tr10. By this, the transistor TR10 is periodically turned on for a short time and controls the charging and discharging of the capacitor C30. Thus, when the transistor Tr10 is turned off, the quantization voltages produced at the junctions $d_1-d_n$ are increased in proportion to the lapse of time thereafter because the capacitor C30 is charged with a constant current; when the transistor Tr10 is again turned on for a short time, the charge in the capacitor C30 is momentarily discharged so that the quantization voltages at the junctions become minimum. That is, the quantization voltages are changed into sawtooth wave form and the period thereof is determined by the period of the pulse generated by the pulse generator 30. The inversion input terminals of the comparator G1-Gn are connected to one end of a memory capacitor C1 through a memory switch S2 and receive the charging voltage of the memory capacitor as the input voltage $Vin_1$. On the other hand, the non-inversion input terminals of the comparators G1-Gn are connected to junctions $d_1-d_n$, respectively, and receive the quantization voltages produced at such junctions. Each of the comparators G1-Gn puts out H-signal when the input voltage $Vin_1$ applied to the inversion input terminal is lower than the quantization voltage applied to the non-inversion input terminal, and puts out L-signal when said input voltage $Vin_1$ is higher than said quantization voltage. Here, for the sake of convenience, it is assumed that the potential of the power line 21 is at the level of H-signal and the potential of the line 22 is at the level of L-signal.

The emitter of a transistor Qo is connected to the output terminal of a comparator G1, the base thereof is connected to the line 22 through a resistor Rbo, and the collector thereof provides an output. This transistor Qo is turned on when the input voltage $Vin_1$ is lower than the quantization voltage at the junction $d_1$. The emitter of a transistor Q1 is connected to the output terminal of a comparator G2, the base thereof is connected to the output terminal of the comparator G1 through a resistor $Rb_1$, and the collector thereof provides an output. Each of the other transistors Q2-Qn-1, like the transistor Q1, has its emitter and base connected between the output terminals of two adjacent comparators whose quantization voltages differ from each other by one stage, and the collector thereof provides an output. The transistors Q1-Qn-1 receive the output of two comparators whose quantization voltages differ from each other by one stage, and only the transistor Q- is rendered conductive when the output of a comparator G- coming into the emitter is at H-level and the output of the other comparator coming into the base is at L-level. That is, the output of the collector of that transistor means a signal representing the quantization voltage at a junction d- corresponding to the input voltage $Vin_1$. The emitter of a transistor Qn is connected to the power line 21, the base thereof is connected to the output terminal of a comparator Gn through a resistor Rbn, and the collector thereof provides an output. This transistor Qn is turned on when the input voltage $Vin_1$ is greater than the quantization voltage at the junction $d_n$. These transistors Qo-Qn produce outputs for encoding the outputs of the comparators G1-Gn.

LED display elements Do-Dn are provided correspondingly to the transistors Qo-Qn, and are connected between the collectors of the corresponding transistors and the constant current source $I_{20}$ for driving the LED display elements by constant current. This relation of correspondence is such that the transistors Qo, Q1, . . . , Qn drive the LED display elements Do, D1, . . . , Dn, respectively. These LED display elements Do-Dn may be disposed, for example, within the viewfinder of a camera and opposed to the scale indicating the shutter speeds. By doing so, any shutter speed which can provide a proper exposure may be displayed within the viewfinder.

Figure 6:
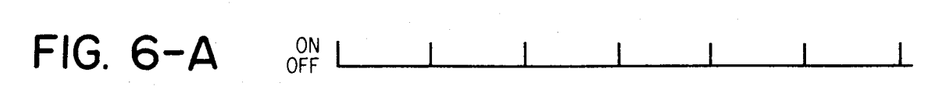
Figure 7:
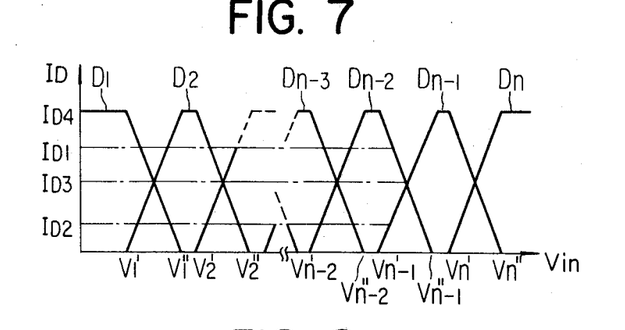
FIGS. 7, 8 and 9 are time charts illustrating the operation of the third embodiment.

Operation will now be described by reference to FIG. 6-A to FIG. 7 showing the operation of the third embodiment. In this embodiment, it should be noted that the capacitance of the capacitor C30 is chosen such that the maximum charging voltage of the capacitor C30 becomes slightly lower than the quantization unit voltage in one period of the pulse generated by the pulse generator 30.

The transistor Tr10 is turned on for a short time each time the pulse generated by the pulse generator 30 arrives at the base of this transistor (this is shown in FIG. 6-A). Therefore, the quantization voltages V1-Vn generated at the junctions $d_1$-$d_n$ are also varied in the form of sawtooth waves (this is shown in FIG. 6-B wherein each quantization voltage is indicated by the same suffixes as those of the junctions $d_1$-$d_n$ at which the quantization voltage is produced, for example, the quantization voltage produced at the junction $d_2$ is indicated by $V_2$.).

Description will now be made of the operation in a case where the analog signal, i.e. the charging voltage $Vin_1$ of the memory capacitor C1, is varied through three stages between the quantization voltage Vn produced at the junction $d_n$ and the quantization voltage dn-1.

In the case of the first stage where the input voltage $Vin_1$ is slightly higher than the minimum value of the quantization voltage Vn-1 (namely, the period of time $t_1$ to $t_5$ in FIG. 6), when the transistor Tr10 is turned on at time $t_1$, the quantization voltages Vn and Vn-1 assume their lowest values Vn' and Vn'-1, respectively, so that the comparators G1-Gn-1 put out L-signals and the comparator Gn puts out H-signal. Therefore, transistors Qo-Qn-2 and Qn are turned off while the transistor Qn-1 is turned on, whereby the LED elements Do-Dn-2 and Dn are turned off while the LED element Du-1 is turned on. Thereafter, the charging voltage of the capacitor C3 is increased in proportion to the lapse of time, and all the quantization voltages V2-Vn are correspondingly increased. When the quantization voltage Vn-1 exceeds the input voltage $Vin_1$ at time $t_2$, the comparators G1-Gn-2 put out L-signals while the comparators Gn-1 and Gn put out H-signals. Therefore, the transistors Qo-Qn-3, Qn-1 and Qn are turned off while the transistor Qn-2 is turned on, so that the LED element Du-1 is turned off while the LED element Dn-2 is turned on. The LED elements Do-Dn-3 and Dn remain turned off. The turn on of the LED element Dn-2 continues even thereafter because the quantization voltage V1-Vn rise to a level slightly lower than the quantization unit voltage. At time $t_3$ when the transistor Tr1 is turned on for a short time, the capacitor C3 discharges so that the quantization voltages V1-Vn drop to their respective lowest values V1' and Vn', whereby the comparators Go-Gn-1 again put out L-signals while the comparator Gn puts out H-signal. Thus, the LED element Dn-2 is again turned off while the LED element Dn-1 is turned on. Again this time, the LED elements Do-Dn-3 and Dn remain turned off. Thereafter, the turn on and off of the LED elements Dn-1 and Dn-2 are alternately repeated. The turn on and off of the LED elements Dn-1 and Dn-2 are illustrated in FIGS. 6-C and 6-D. FIG. 6-C shows the turn on and off of the LED element Dn-2 caused by the transistor Qn-2, and FIG. 6-D shows the turn on and off of the LED element Dn-1 caused by the transistor Qn-1. In the case of this first stage, the lowest value Vn'-1 of the quantization voltage is approximate to the input voltage $Vin_1$, so that the time during which the transistor Qn-1 is turned on within the period during which the transistor Tr10 is turned on, namely, the interval between $t_1$ and $t_2$, becomes short, and the time during which the transistor Qn-2 is turned on, namely, the interval between $t_2$ and $t_3$, becomes long. Therefore, the time during which the LED element Dn-2 is turned on is longer than the time during which the LED element Dn-1 is turned on, and from the difference in brightness resulting from the difference between the turn-on times of the two LED elements, it is indicated that the input voltage $Vin_1$ lies between the two quantization signals Vn-1 and Vn, and yet has a value approximate to the quantization voltage Vn-1. The average currents flowing into the LED elements Dn-1 and Dn-2 at this time are shown in FIG. 7. More specifically, the average current $ID_1$ flows into the LED element Dn-2 having a longer turn-on time, and the average current $ID_2$ smaller than the average current $ID_1$ flows into the LED element Dn-1 having a shorter turn-on time. The magnitudes of these average currents are determined by the turn-on times of the LED elements Dn-1 and Dn-2. Therefore, if the period of the pulse generated by the pulse generator 30 is sufficiently short, the LED element Dn-2 may sometimes look brighter than the LED element Dn-1. If this is used for the shutter speed display, a value between the shutter speed corresponding to the LED elements Dn-1 and Dn-2 and closer to the shutter speed corresponding to the LED element Dn-1 may be displayed.

Next, in the case of a second stage wherein the input voltage $Vin_1$ is at a value substantially intermediate the highest value Vn"-1 and the lowest value Vn'-1 of the quantization voltage Vn-1 (in FIG. 6-B, between the times $t_5$-$t_9$), when the transistor Tr10 is turned on at time $t_5$, the comparators G1-Gn-1 put out L-signals while the comparator Gn puts out H-signal. This causes the LED element Dn-1 alone to be turned on. Thereafter, the quantization voltages V1-Vn are increased with lapse of time. When the quantization voltage Vn-1 exceeds the input voltage $Vin_1$ at time $t_6$, the comparators G1-Gn-2 put out L-signals while the comparators Gn-1 and Gn put out H-signals, thus turning on only the LED element Dn-2. When the transistor Tr1 is again turned on at time $t_7$, the LED element Dn-1 alone is turned on. Thereafter, turn on and off of the LED elements Dn-1 and Dn-2 are repeated. In the case of this second stage, the charging voltage $Vin_1$ is at a value substantially intermediate the maximum value Vn"-1 and the minimum value Vn'-1 of the quantization voltage Vn-1, so that the interval between the time $t_5$ and the time $t_6$ becomes substantially equal to that between the time $t_6$ and the time $t_7$. Accordingly, the turn-on times of the LED elements Dn-1 and Dn-2 become substantially equal to each other, and it is indicated that the charging voltage $Vin_1$ is at a value substantially intermediate the maximum value Vn"-1 and the minimum value Vn'-1 of the quantization signal Vn-1. The average currents then flowing into the LED elements Dn-1 and Dn-2 are also equal to each other as shown by the average current $ID_3$ in FIG. 7. Therefore, both the LED elements Dn-1 and Dn-2 look equal in brightness. If this is used for the shutter speed display, a value intermediate the shutter speeds corresponding to the LED elements Dn-1 and Dn-2 may be displayed. Thereafter, as the charging voltage rises, the relation between the turn-on times of the LED elements Dn-1 and Dn-2 is reversed from that in the first stage.

Next, in the case of a third stage wherein the charging voltage $Vin_1$ is between the maximum value $Vn''-1$ of the quantization voltage $Vn-1$ and the minimum value $Vn'$ of the quantization voltage $Vn$, the quantization voltages $V1-Vn$ are varied after time $t_0$ in FIG. 6-B and yet the comparator $Gn$ puts out H-signal. Thus, the LED element $Dn-1$ alone continues to be turned on to indicate that the charging voltage $Vin_1$ has become substantially equal to the quantization voltage $Vn$. At this time, the LED element $Dn-1$ alone is turned on, so that the maximum current $ID_4$ flows to this LED element $Dn-1$ as shown in FIG. 7. The range within which the LED element $Dn-1$ alone is turned on is a range within which the input voltage $Vin_1$ is between the maximum value $Vn''-1$ of the quantization voltage $Vn-1$ and the minimum value $Vn'$ of the quantization voltage $Vn$, and even if the input voltage $Vin_1$ is varied in this range, the other LED elements are not turned on. In this case, it is indicated that the shutter speed corresponds to the LED element $Dn-1$.

The above-described operation also takes place for the other LED elements in accordance with the value of the charging voltage $Vin_1$ of the memory capacitor $C1$ and the variation in this charging voltage $Vin_1$ is displayed as an analogous change of the brightness. On the other hand, when the input voltage $Vin_1$ becomes less than the minimum value of the quantization voltage $V1$ or greater than the maximum value of $Vn$, the LED element $D1$ or $Dn$ alone is turned on to indicate that the input voltage $Vin_1$ is outside the distinctly indicatable range.

Figure 8:
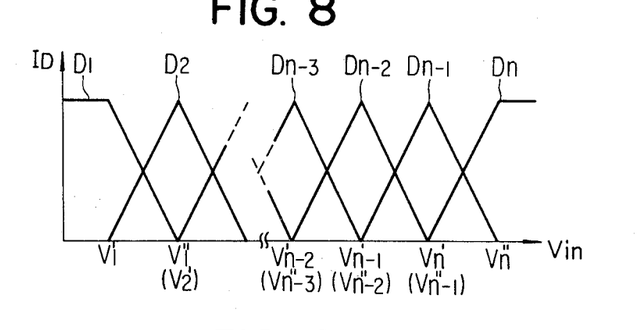

FIG. 8 illustrates the relation between the average current ID flowing into the LED elements $D1-Dn$ and the input voltage $Vin_1$ in the case where the capacitance of the capacitor $C30$ in the third embodiment is set such that the width of the maximum and the minimum value of the charging voltage of the capacitor $C30$ become equal to the unit quantization voltage in one period of the pulse generated by the pulse generator 30. In this case, as will be seen from comparison of FIG. 7 and FIG. 8, the turn-on states of the LED elements $D1-Dn$ are varied if the charging voltage $Vin_1$ is varied.

Figure 9:
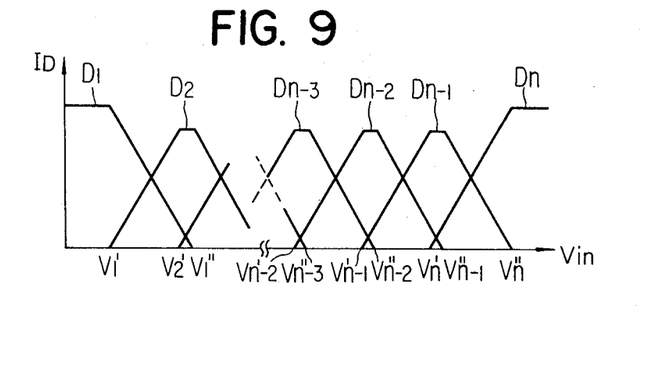

FIG. 9 illustrates the relation between the average current ID flowing into the LED elements $D1-Dn$ and the charging voltage $Vin_1$ of the memory capacitor $C1$ in the case where the capacitance of the capacitor $C30$ in the third embodiment is set such that the width of the maximum and the minimum value of the charging voltage of the capacitor $C30$ become slightly higher than the unit quantization voltage in one period of the pulse generated by the pulse generator 30. In this case, the three turn-on states, namely, the state in which one LED element is turned on, the state in which two LED elements are turned on, and the state in which three LED elements are turned on. However, in what state the input voltage $Vin_1$ is between the quantization voltages can be distinguished from the difference in brightness of the LED elements, as in the case of FIGS. 7 and 8.

In the present embodiment, the quantization voltages are varied in sawtooth wave form, but alternatively, the same operation as that of the third embodiment may be obtained even by varying the analog voltage, i.e. the input voltage $Vin_1$, in sawtooth wave form prior to being applied to the inversion input terminal of the comparators $G1-Gn$, and applying it to the inversion input terminal of the comparators $G1-Gn$.

Figure 10:
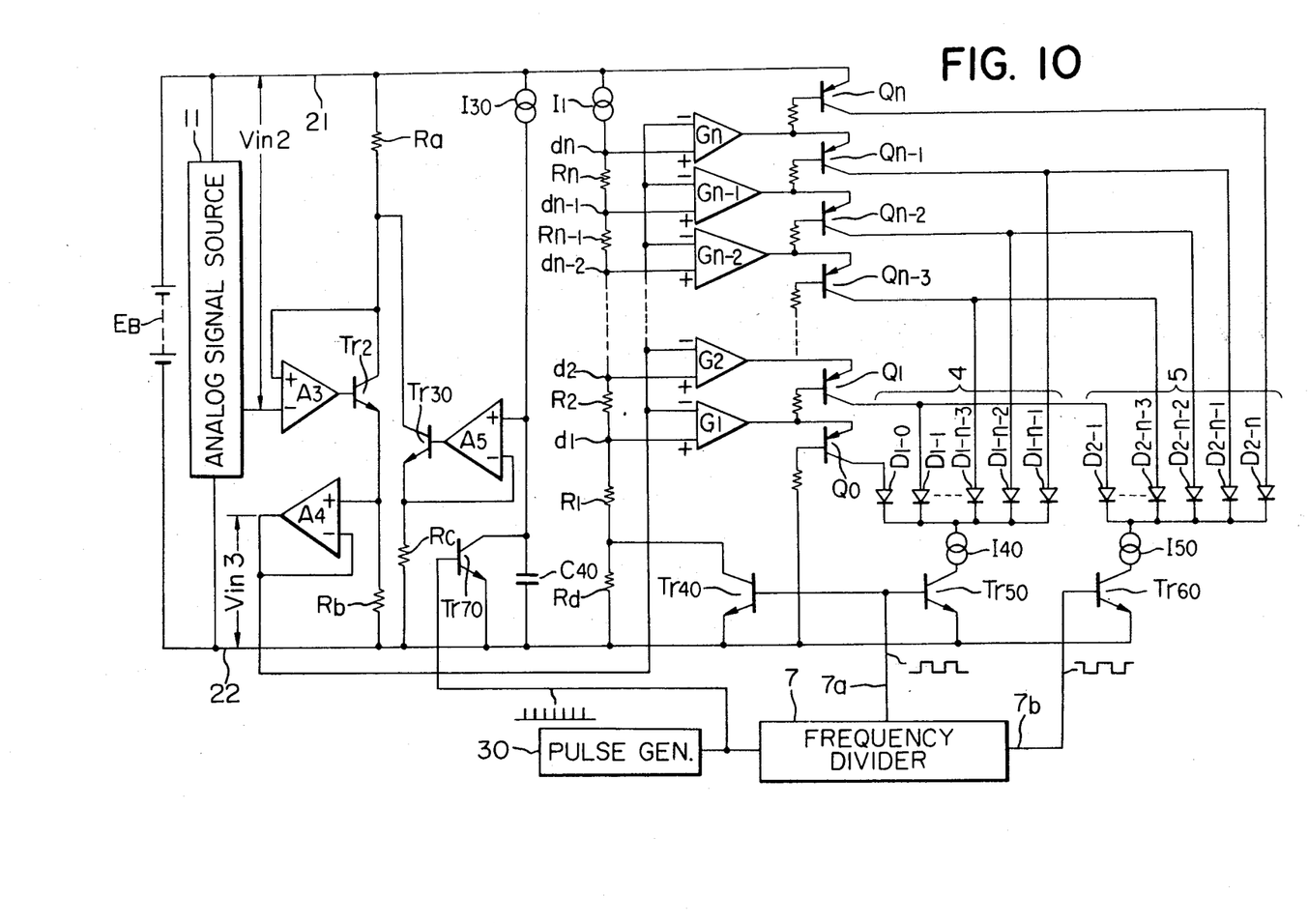
FIG. 10 is a circuit diagram showing a fourth embodiment of the present invention.

FIG. 10 is a circuit diagram of a fourth embodiment of the present invention. In this embodiment, the analog input voltage is varied in sawtooth wave form and the number of comparators is economized and they are used in overlapped relationship and therefore, each of the quantization voltages is vibrated by a predetermined voltage, namely, the differential voltage between the quantization voltage produced at the junction $d_n$ and the quantization voltage produced at the junction $d_1$. In FIG. 10, the analog input voltage $Vin_2$ whose reference potential is the voltage produced on the power line 21 by the analog signal source 11 is applied to the inversion input terminal of the operational amplifier A3. The non-inversion input terminal of the operational amplifier A3 is connected to the power line 21 through a resistor Ra. The collector of a transistor Tr2 is connected to the non-inversion input terminal of the operational amplifier A3, the base thereof is connected to the output terminal of the operational amplifier A3, and the emitter thereof is connected to a line 22 through a resistor Rb. The operational amplifier A3, resistor Ra, and transistor Tr2 convert the analog input voltage $Vin_2$ into a current corresponding thereto, namely, the emitter current of the transistor Tr2. The inversion input terminal of the operational amplifier A4 is connected to the output terminal thereof, and the non-inversion input terminal is connected to the junction between the emitter of the transistor Tr2 and the resistor Rb. Thus, the operational amplifier A4 constitutes a voltage follower circuit and generates a second analog voltage $Vin_3$ whose reference potential is the voltage produced on the line 22. The variation in the second analog voltage $Vin_3$ may be made coincident with or greater or less than the variation in analog input voltage $Vin_2$ by selecting the values of the resistors Ra and Rb. This second analog voltage $Vin_3$ may provide an input to the comparators $G1-Gn$. A constant current source $I_{30}$ and a capacitor $C40$ are series-connected between the power lines 21 and 22. Thus, the capacitor $C40$ is charged with constant current. A transistor Tr70 parallel-connected to the capacitor $C40$ is periodically turned on for a short time by a pulse of a predetermined period generated by a pulse generator 30 and causes the capacitor $C40$ to discharge. The shunt circuit comprising an operational amplifier A50, a transistor Tr30 and a resistor Rc, substracts from the collector current of the transistor Tr2 the collector current of the transistor Tr30 corresponding to the charging voltage of the capacitor $C40$. Therefore, the second analog voltage $Vin_3$ put out by the operational amplifier A40 is varied in sawtooth wave form. In the present embodiment, the collector current of the transistor Tr2 is shunted by the shunt circuit so that the second analog voltage $Vin_3$ is vibrated at an amplitude within the unit quantization voltage.

A resistor Rd is connected between the ladder resistor R1 and the line 22, and the resistance value thereof is selected so as to generate a voltage equal to the differential voltage between the voltages generated at the junctions $d_1$ and $d_n$ by the current from the constant current source $I_1$. That is, the value of the resistor Rd is equal to the sum of the values of the resistors $R2-Rn$. The transistor Tr40 is parallel-connected to the resistor Rd.

LED elements $D1-o-D1-n-1$ belonging to a first LED element group 4 are provided corresponding to transistors $Qo-Qn-1$, and are connected between associated transistors and the constant current source $I_{40}$. The correspondence of the LED elements is set such that the transistors Qo, Q1, . . . , Qn-1 drive the LED elements D1-o, D1-1, . . . , D1-n-1, respectively. This first LED element group 4 displays the encoded output of the transistors Qo-Qn-1 in a first mode.

LED elements D2-n-D2-n belonging to a second LED element group 5 are provided corresponding to transistors Q1-Qn, and are connected between the collectors of associated transistors and the constant current source $I_{50}$. The correspondence of these LED elements is set such that the transistors Q1, Q2, . . . , Qn drive the LED elements D2-1, D2-2, . . . , D2-n, respectively. The second LED element group 5 displays the encoded output of the transistors Q1-Qn. That is, the driving lines extending from the transistors Q1-Qn-1 to the first and second LED element groups 4, 5 are each divided into two lines, one of which is connected to the first LED element group 4 and the other is connected to the second LED element group 5. Transistor Tr50 is series-connected between the constant current source $I_{40}$ and the line 22, and transistor Tr60 is series-connected between the constant current source $I_{50}$ and the line 22.

A flip-flop circuit 7, which is a frequency divider, receives as input the pulse from the pulse generator 30 and frequency-divides such pulse into ½ and puts out from output terminals 7a, 7b square wave outputs which are 180° out of phase with each other. The square wave output of duty ratio 50% from the output terminal 7a is applied to the bases of transistors Tr40 and Tr50, and the square wave output of duty ratio 50% from the output terminal 7b is applied to the base of transistor Tr60. Thus, the transistors Tr40, Tr50 and Tr60 are turned on and off with 180° phase difference therebetween.

Figure 11:
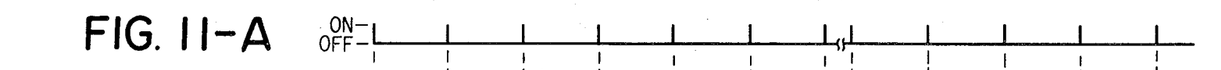

Reference is now made to the timing charts of FIG. 11-A to FIG. 11-F to describe operation. As shown in FIG. 11-A, the transistor Tr70 is periodically turned on for a short time so that the second analog voltage $V_{in3}$ is varied in sawtooth wave form as shown in FIG. 11-C. As seen in FIG. 11B, the transistors Tr40 and Tr50 are repeatedly turned on and off at a period double that of the pulse from the generator 30 by the output from the frequency divider 7. Thus, as shown in FIG. 11-C, the quantization voltages V1-Vn produced at the junctions $d_1$-$d_n$ are periodically vibrated with a voltage difference between the junctions $d_1$ and $d_n$. The state in which the transistors Tr40 and Tr50 are turned on while the transistor Tr60 is turned off and the quantization voltages V1-Vn are in low ranges with the first LED element group 4 capable of being turned on but the second LED element group 5 incapable of being turned on is hereinafter refered to as the first state of the display circuit. On the other hand, the state in which the transistors Tr40 and Tr50 are turned off while the transistor Tr60 is turned on and the quantization voltages V1-Vn are in a high range with the first LED element group 4 incapable of being turned on but the second LED element group 5 capable of being turned on is hereinafter referred to as the second state of the display circuit.

Description will now be made of a case where the second analog voltage $V_{in3}$ is varied in three stages as illustrated in FIG. 11-C. First, the case of the first stage in which the analog input voltage $V_{in3}$ is varied across the quantization voltage produced at junction dn-1 (in FIG. 11-C, times $t_{11}$-time $t_{15}$): when the display circuit is in the first state, and if the second analog voltage $V_{in3}$ is between the quantization voltages Vn and Vn-1 at time $t_{11}$, the comparators G1-Gn-1 puts out L-signals while the comparator Gn puts out H-signal, so that the transistors Qo-Qn-2 and Qn are turned off and transistor Qn-1 is turned on. Therefore, as shown in FIG. 11-E, only the LED element D1-n-1 in the first LED element group 4 is turned on. When the second analog voltage $V_{in3}$ drops to intersect the quantization voltage Vn-1 at time $t_{12}$, the comparators G1-Gn-2 put out L-signals while the comparators Gn-1 and Gn put out H-signals, so that the transistors Q1-Qn-3, Qn-1 and Qn are turned off and the transistor Qn-2 is turned on. Therefore, the LED element D1-n-2 alone is turned on this time, as shown in FIG. 11-D. This LED element D1-n-2 remains turned on until the second analog voltage $V_{in3}$ further drops and time $t_{13}$ is reached. When the display circuit assumes its second state at time $t_{13}$, the analog voltage $V_{in3}$ momentarily rises to its initial level, but since all the quantization voltages Vn and V1 to reach V'1-V'n, all the comparators G1-Gn put out H-signal. Thus, the transistor Qo is turned on, but since the transistor Tr60 is turned on while the transistor Tr40 and Tr50 are turned off, no LED element in the first and second LED element groups 4 and 5 is turned on. Thereafter, when the display circuit restores its first state at time $t_{14}$, the LED elements D1-n-2 and D1-n-1 are turned on as already noted. As already described in connection with the third embodiment, the turn-on time of the LED elements D1-n-2 and D1-n-1 in the alternate turned-on state is determined by the point between the quantization voltage Vn and Vn-1 at which the maximum value of the third analog voltage $V_{in3}$ lies. The display provided by the alternate turn on and off of the LED elements D1-n-2 and D1-n-1 may be analogously observed as can be the third embodiment, if the period of the pulse generated by the pulse generator 30 is shortened.

In the case of the second stage wherein the second analog voltage $V_{in3}$ is varied in sawtooth wave form between quantization voltages Vn and Vn-1 (time $t_{15}$-$t_{17}$ in FIG. 11): since the second analog voltage $V_{in3}$ never intersects the quantization voltages Vn and Vn-1, no alternate turn on and off of two LED elements takes place. That is, the comparators G1-Gn-1 put out L-signals while the comparator Gn puts out H-signal and therefore, the transistor Qn-1 turns on the LED element D1-n-1. On the other hand, the LED element D1-n-1 is turned on when the display circuit is in its first state and turned off when the display circuit is in its second state, because the display circuit alternately repeats its first and second states. Thus, LED element D1-n-1 alone is turned on and off but this may be observed as if the element were continuously turned on, by shortening the period of the pulse generated by the pulse generator 30.

In the case of the third stage wherein the second analog voltage $V_{in3}$ intersects the quantization voltage Vn and is varied in sawtooth wave form (time $t_{21}$-$t_{25}$ in FIG. 11): when the display circuit is in its first state and when the second analog voltage $V_{in3}$ becomes greater than the quantization voltage Vn at time $t_{21}$, all the comparators G1-Gn put out L-signals, so that transistors Q1-Qn-1 are turned off while the transistor Qn is turned on. On the other hand, at this time, the transistor Tr50 is turned on and the transistor Tr60 is turned off and thus, no LED element in the first and second LED element groups 4 and 5 is turned on. When the second analog voltage $V_{IN3}$ drops to intersect the quantization voltage Vn at time $t_{22}$, the comparators G1-Gn-1 put out L-signals while the comparator Gn puts out H-signal, so that the transistor Qn-1 is turned on to turn on the LED element D1-n-1, as shown in FIG. 11-E. This LED element D1-n-1 remains turned on until the second analog voltage further drops and time $t_{23}$ is reached. When the display circuit assumes its second state at time $t_{23}$, the second analog voltage $Vin_3$ momentarily rises to its initial level and at this time, all the quantization voltages V1–Vn have risen to V'1–V'n by the differential voltage between the quantization voltages Vn and V1, so that the comparator G1 puts out L-signal and the comparators G2–Gn put out H-signals. When this occurs, the transistor Tr60 is turned on while the transistor Tr50 is turned off, so that the transistor Q1 is turned on by the L-signal of the comparator G1 and the H-signal of the comparator G2 and turns on the LED element D2-1 in the second LED element group 5, as shown in FIG. 11-F. This LED element D2-1 remains turned on from time $t_{23}$ till time $t_{24}$ whereat the second analog voltage $Vin_3$ intersects the quantization voltage V'1. When time $t_{24}$ is passed, all the comparators G1–Gn put out H-signals to thereby turn on the transistor Qo. Since, however, the display circuit is in its second state, the transistor Tr50 is turned off and therefore, no element in the LED element groups 4 and 5 is turned on. The above-described operation takes place each time the display circuit repeats the two states alternately.

From the foregoing description of the cases where the second analog signal $Vin_3$ is varied in three stages, the operation of any other case will become apparent. According to the fourth embodiment, the operation range distinctly indicatable is doubled for the same number of comparators, as compared with the third embodiment.

In the description hitherto made, one of the inputs of the comparators G1–Gn is varied in the sawtooth wave form, but the same effect as described may be obtained by varying said input in rectangular wave form or sine wave form. The display elements are not restricted to LED elements, but may be electro-optical elements such as filament lamps, liquid crystals or electric coloring elements.

According to the third and fourth embodiments of the present invention, it is possible that analog input signals existing in the intermediate range of two adjacent quantization values may be displayed as digital signals incorporating analogous displays. Accordingly, there is provided a display circuit which readily enables variations of analog signals to be observed.

What I claim is:

1. A digital display circuit for indicating an analog signal voltage comprising:
    means for generating a plurality of reference voltages quantized at a predetermined voltage width;
    first modulating means for periodically modulating said analog signal so that the modulated analog signal in one period may have a section where the amplitude continuously varies as time advanced;
    second modulating means for periodically modulating every each of the reference voltages in synchronization with said first modulating means so that each of the modulated reference voltages may alternatively have two amplitudes of a higher level and a lower level, the voltage difference between said higher and lower levels being substantially equal to the difference between the highest and lowest reference voltages;
    a plurality of comparators corresponding to each of said plurality of reference voltages for comparing said modulated analog signal voltage with each of said modulated reference voltages and for producing outputs in accordance with the respective compared results;
    selecting means connected to said comparators and having output terminals equal in number to said comparators for generating a drive signal at only one of said output terminals, which is fixed in the relation between the modulated analog signal voltage and the modulated reference voltages;
    a pair of display means each consisting of display elements which are connected to respective output terminals of said selecting means and successively arranged in such a sequence that the order in arrangement of the display element sequence in respective one of said display means pair corresponds to that in amplitude of the reference voltages, and also the element corresponding to the highest reference voltage in one of said display means pair being positioned adjacent to the element corresponding to the lowest reference voltage in the order of said display means pair; and
    driving means for alternately rendering said pair of display means operative so that said one of the display means pair may be operative while said modulated reference voltages are in the lower level and said the other of the display means pair may be operative while said modulated reference voltages are in the higher level,
    one of said display elements which is associated with said drive-signal generated output terminal of the selecting means and also with said operative display means being energized.

2. A digital display circuit according to claim 1, wherein the amplitude width in said section of the modulated analog signal is substantially half the predetermined width of the quantized reference voltages.

3. A digital display circuit according to claim 1, wherein said modulated analog signal is in a sawtooth waveform.

4. A digital display circuit according to claim 3 including a constant current circuit (A3, Ra, Tr2) for flowing through a resistor (Rb) a current corresponding to said analog signal voltage ($Vin_2$), a capacitor (C40) series-connected to a constant current source ($I_{30}$) so as to be charged with a constant current, a switching element (Tr70) parallel-connected to said capacitor, an oscillator (30) for generating a pulse for periodically turning on said switching element for a short time, a shunt circuit (A5, Tr30, Rc) connected to said constant current circuit so as to subtract from the current of said constant current circuit a current corresponding to the voltage charged into said capacitor (C40), and a voltage follower circuit (A4) connected to each of said comparators so as to put out the same voltage as the voltage produced across said resistor (Rb) and to apply it as the analog input voltage to one of the inputs of each of said comparator, whereby in the OFF state of said switching element (Tr70), said capacitor (C40) is charged and the output voltage of said voltage follower circuit is decreased in accordance with the charging voltage of said capacitor, and in the ON state of said switching element, said capacitor is discharged and the output voltage of said voltage follower circuit is restored to its initial potential.

5. A digital display circuit for indicating an analog signal voltage comprising:
   means for generating a plurality of reference voltages quantized at a predetermined voltage width;
   first modulating means for periodically modulating said analog signal so that the modulated signal may alternately have two amplitudes of a higher level and a lower level, the voltage difference between the higher and lower levels being substantially equal to the difference between the highest and lowest reference voltages;
   second modulating means for periodically modulating every each of the reference voltages in synchronization with said first modulating means so that each of the modulated reference voltages may have a section where the amplitude varies as time advanced;
   a plurality of comparators corresponding to each of said plurality of reference voltages for comparing said modulated analog signal voltage with each of said modulated reference voltages and for producing outputs in accordance with the respective compared results;
   selecting means connected to said comparators and having output terminals equal in number to said comparators for generating a drive signal at only one of said output terminals, which is fixed in the relation between the modulated analog signal voltage and the modulated reference voltages;
   a pair of display means each consisting of display elements which are connected to respective output terminals of said selecting means and successively arranged in such a sequence that the order in arrangement of the display element sequence in respective one of said display means pair corresponds to that in amplitude of the reference voltages, and also the element corresponding to the highest reference voltage in one of said display means pair being positioned adjacent to the element corresponding to the lowest reference voltage in the other of said display means pair; and
   driving means for alternately rendering said pair of display means operative so that said one of the display means pair may be operative while said modulated analog signal is in the lower level and said the other of the display means pair may be operative while said modulated analog signal is in the higher level, one of said display elements which is associated with said drive-signal generated output terminal of the selecting means and also with said operative display means being energized.

6. A parallel comparison type analog-to-digital converter for performing a parallel comparison of an analog input voltage with a plurality of digitalizing voltages by means of a plurality of comparators to convert the analog input voltage into a digitalized output, comprising:
   control means having first and second control states occuring alternatively for permitting said plurality of comparators to perform a comparison of the analog input voltage in a first voltage range when said control means is in the first control state and for permitting said plurality of comparators to perform a comparison of the analog input voltage in a second voltage range when said control means is in the second control state, said control means comprising an oscillator circuit for operating switch means alternately to switch between the first and second control states and periodically to oscillate one set of the input voltages to said plurality of comparators with an amplitude substantially equal to the difference between the highest and lowest values of the digitalizing voltages, the oscillations being in synchronism with the switching between the first and second control states;
   said oscillator circuit further comprising means for oscillating another set of the input voltages to said plurality of comparators with an amplitude smaller than the unit digitalizing voltage so that the oscillated another set of the input voltage in one cycle may have a section where the amplitude varies as time advanced, and with cycles different from the switching cycles of the first and second control states but in synchronism with the switching of the first and second control states;
   first display means for displaying the outputs from said comparators;
   second display means for displaying the outputs fram said comparators; and
   means for operating said first display means in the first control state and operating said second display means in the second control state.

7. A parallel comparison type analog-to-digital converter according to claim 6, wherein said oscillated another set of the input voltages is in a sawtooth waveform.

* * * * *

UNITED STATES PATENT AND TRADEMARK OFFICE
CERTIFICATE OF CORRECTION

PATENT NO. : 4,365,236

DATED : December 21, 1982

INVENTOR(S) : OSAMU MAIDA

It is certified that error appears in the above-identified patent and that said Letters Patent is hereby corrected as shown below:

Column 1, line 49, change "comparising" to --comprising--.

Column 4, line 62, change "continuwe" to --continue--.

Column 9, line 37, change "Du - 1" to --Dn - 1--;

line 46, change "Du - 1" to --Dn - 1--.

Column 14, line 67, change "VIN$_3$" to --Vin$_3$--.

Signed and Sealed this

Fifteenth Day of March 1983

[SEAL]

Attest:

GERALD J. MOSSINGHOFF

Attesting Officer

Commissioner of Patents and Trademarks